US009370135B2

(12) United States Patent
Okada et al.

(10) Patent No.: US 9,370,135 B2
(45) Date of Patent: Jun. 14, 2016

(54) ELECTRONIC COMPONENT MOUNTING DEVICE AND IMAGE READING METHOD USED BY ELECTRONIC COMPONENT MOUNTING DEVICE

(75) Inventors: Yasuichi Okada, Yamanashi (JP); Masayuki Arase, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 406 days.

(21) Appl. No.: 13/980,207

(22) PCT Filed: Nov. 29, 2011

(86) PCT No.: PCT/JP2011/006648
§ 371 (c)(1),
(2), (4) Date: Jul. 17, 2013

(87) PCT Pub. No.: WO2012/114406
PCT Pub. Date: Aug. 30, 2012

(65) Prior Publication Data
US 2013/0286186 A1    Oct. 31, 2013

(30) Foreign Application Priority Data

Feb. 21, 2011    (JP) ................................. 2011-034090

(51) Int. Cl.
*H05K 13/04*    (2006.01)
*H05K 13/08*    (2006.01)
(52) U.S. Cl.
CPC ............ *H05K 13/0404* (2013.01); *H05K 13/08* (2013.01)
(58) Field of Classification Search
CPC ........................ H05K 13/0404; H05K 13/0413
See application file for complete search history.

(56) References Cited

U.S. PATENT DOCUMENTS 5,864,944 A * 2/1999 Kashiwagi ......... H05K 13/0413
29/712
6,971,161 B1 * 12/2005 Maenishi ............... H05K 13/04
29/739

(Continued)

FOREIGN PATENT DOCUMENTS

JP    08-181494 A    7/1996
JP    10-200297 A    7/1998

(Continued)

OTHER PUBLICATIONS

International Search Report for PCT/JP2011/006648 dated Jan. 17, 2012.

*Primary Examiner* — Sath V Perungavoor
*Assistant Examiner* — Peter D Le
(74) *Attorney, Agent, or Firm* — Pearne & Gordon LLP

(57) ABSTRACT

Image readers 6A and 6B that read images of electronic components held by first mounting heads 14A and 14B are each configured to have a line sensor arranged at an oblique arrangement angle with respect to a first direction, and in an image acquiring step of selecting any one of a first-directional scanning operation and a second-directional scanning operation is to be conducted by mounting heads 14A and 14B based on a predetermined scanning operation selecting condition set in advance, and acquiring image signals from the image readers 6A and 6B, image conversion processing of arranging one-dimensional images obtained by converting one-dimensional images sequentially output from the line sensor by an arrangement angle in parallel to generate a two-dimensional image is executed.

2 Claims, 9 Drawing Sheets

(56) References Cited

U.S. PATENT DOCUMENTS

| | | | | |
|---|---|---|---|---|
| 2001/0030298 A1* | 10/2001 | Sakaguchi | ............ | H05K 13/08 250/559.29 |
| 2002/0071601 A1* | 6/2002 | Kawada | ............ | H05K 13/0413 382/145 |
| 2002/0135676 A1* | 9/2002 | Hatase | ............ | H04N 1/047 348/140 |
| 2005/0102826 A1* | 5/2005 | Asai | ............ | H05K 13/0452 29/743 |
| 2005/0129301 A1* | 6/2005 | Kanno | ............ | G01R 31/2893 382/145 |
| 2006/0185162 A1* | 8/2006 | Aoki | ............ | H05K 13/0452 29/832 |
| 2009/0119912 A1* | 5/2009 | Watanabe | ............ | H05K 13/021 29/832 |
| 2010/0097461 A1* | 4/2010 | Utsumi | ............ | H05K 13/0413 29/832 |
| 2010/0321487 A1* | 12/2010 | Endo | ............ | H05K 13/0413 348/87 |

FOREIGN PATENT DOCUMENTS

| | | |
|---|---|---|
| JP | 2005-277132 A | 10/2005 |
| JP | 2010-080696 A | 4/2010 |

* cited by examiner

ELECTRONIC COMPONENT MOUNTING DEVICE AND IMAGE READING METHOD USED BY ELECTRONIC COMPONENT MOUNTING DEVICE

TECHNICAL FIELD

The present invention relates to an electronic component mounting device that mounts electronic components on a substrate, and an image reading method that reads an image of the electronic components in the electronic component mounting device.

BACKGROUND ART

In the electronic component mounting device that mounts the electronic components such as a semiconductor chip on the substrate, a camera using a line sensor such as a CCD in which image pickup elements are aligned in rows has been widely used up to now as an image reader for correcting a position gap between the electronic components and the substrate at the time of mounting by image recognition. When the image is read by the line sensor, there is a need to conduct scanning operation of relatively moving an electronic component to be read, and the line sensor in a direction orthogonal to an element array direction. For that reason, in the arrangement of the line sensor in the layout within the electronic component mounting device, there is a need to set in advance a movement direction of a mounting head when conducting the scanning operation. In general, in the electronic component mounting device configured so that respective component supply units are arranged on both sides of a substrate transfer path, the line sensor is arranged so that the element array direction matches a substrate transfer direction (first direction), or matches a second direction orthogonal to the first direction. However, even when any one of the above-mentioned arrangements is applied as the arrangement of the line sensor, such an arrangement has advantages and disadvantages from the viewpoint of optimizing the efficiency of the component mounting operation by the mounting head.

That is, when the line sensor is arranged so that the element array direction matches the first direction, the scanning operation for reading the image is conducted by moving the mounting head in the second direction. In this case, since the mounting head can move in a shortest path from the component supply unit toward the substrate, it is advantageous that a movement distance becomes shorter. However, when two mounting heads that face each other through the substrate are provided as a component mounting mechanism, because interference is generated between the respective mounting heads depending on the operating state of the facing mounting heads, the scanning operation for reading the image cannot be always executed at an arbitrary timing. In this case, a loss time is generated by a standby time since the facing mounting heads complete the component mounting operation until the mounting head is retreated from the substrate.

On the contrary, when the line sensor is arranged so that the element array direction matches the second direction, the scanning operation for reading the image is conducted by moving the mounting head in the first direction. In this case, since the mounting head moves along the substrate transfer path to conduct the scanning operation, it is advantageous that the scanning operation is enabled regardless of the operating state of the facing mounting heads. However, the movement distance of the mounting heads in the scanning operation necessarily becomes longer, resulting in that a required time for reading the image is increased. In order to eliminate a disadvantage caused by thus fixing the array direction of the line sensor to one direction, there has been proposed a configuration using a camera in which two line sensors are combined together into a cross shape (refer to Patent Literature 1).

CITATION LIST

Patent Literature

Patent Literature 1: JP-A-2010-80696

SUMMARY OF INVENTION

Technical Problem

However, in the prior art disclosed in the above-mentioned Patent Literature example, the configuration using two line sensors suffers from drawbacks described below. That is, in the above-mentioned prior art, since the two independent line sensors are arranged to be orthogonal to each other in a plan view with precise, there arises such a problem in manufacturing and assembling of a camera that it is difficult to adjust a positional relationship between the two line sensors. Further, since the two independent line sensors are substantially used, the manufacturing costs of the camera necessarily rise. Further, because the line sensors have a slight variation of the performance caused by an error in a manufacturing process, there arises a large number of problems in the application of the above-mentioned configuration to an actual device such that the images taken by the two line sensors are strictly different from each other, and a fine adjustment work is additionally required. Thus, the prior art suffers from such a problem that it is difficult to shorten a required time for reading an image by excluding a restriction of the operation of the mounting head which is caused by the array direction of the line sensor, by an image read unit having a simple configuration.

Under the circumstance, the present invention aims at providing an electronic component mounting device and an image reading method in the electronic component mounting device, which can shorten a required time for reading an image with the exclusion of a restriction of the operation of the mounting head caused in the array direction of the line sensor by an image reading unit having a simple configuration.

Advantageous Effects of Invention

According to the present invention, in order to read the image of the electronic component by the line sensor arranged obliquely with respect to the substrate transfer direction by a given arrangement angle in a component extracting step of extracting the electronic component from the component supply unit by the mounting head, in the image acquiring step of selecting any one of the first-directional scanning operation and the second-directional scanning operation is to be conducted by the mounting head based on a predetermined scanning operation selecting condition in advance, and conducting the selected scanning operation by the mounting head to acquire the image signal from the image reading unit, the image conversion processing of arranging the one-dimensional images obtained by converting the one-dimensional images sequentially output from the line sensor based on the arrangement angle of the line sensor in parallel to generate the two-dimensional image is executed. The above processing can reduce a required time for reading the image with the exclusion of the restriction of the operation of the mounting head caused in the array direction of the line sensor by an image reading unit having the simple configuration.

DESCRIPTION OF EMBODIMENTS

Figure 1:
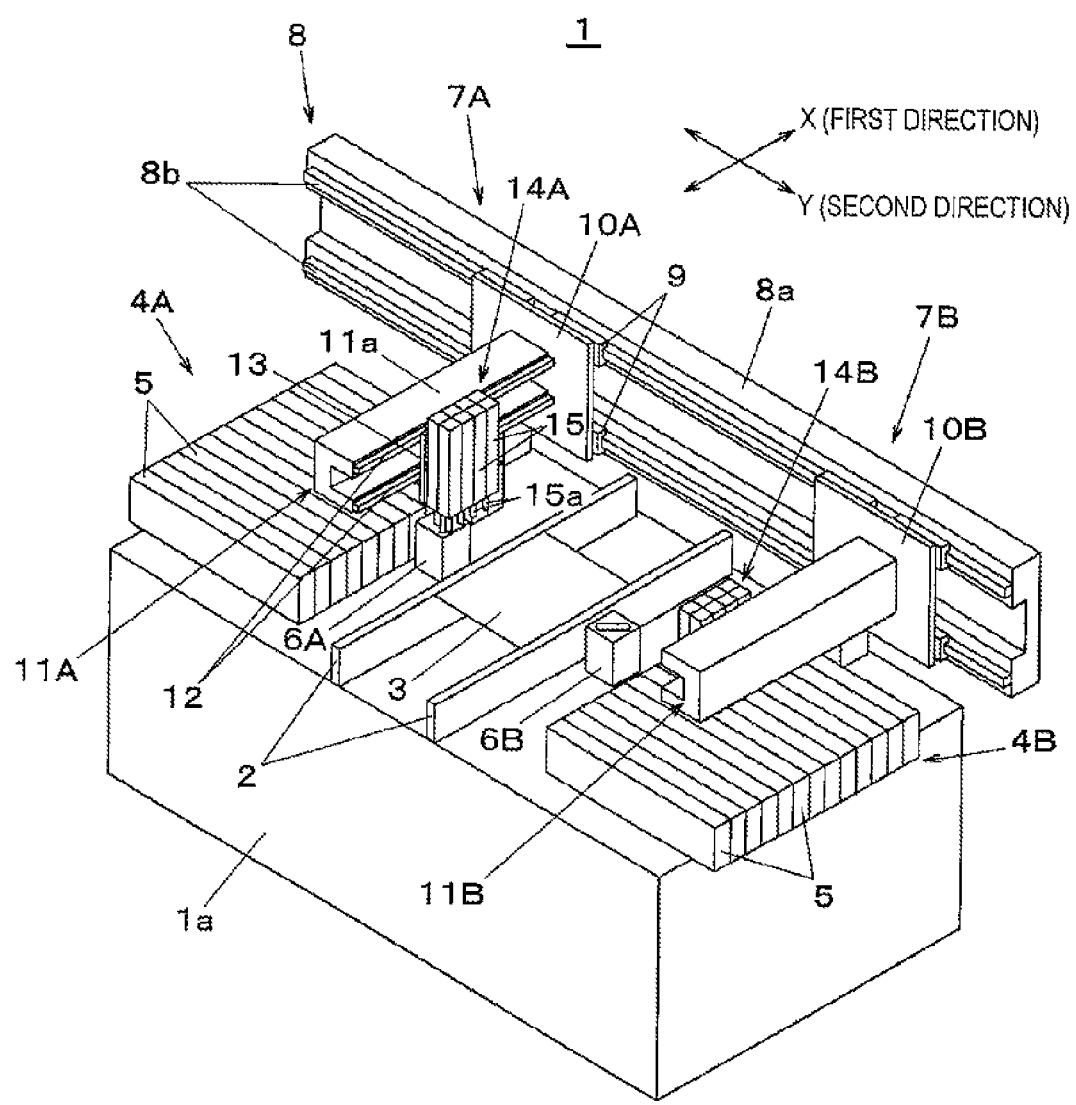
FIG. 1 is a perspective view of an electronic component mounting device according to an embodiment of the present invention.

Subsequently, a description will be given of embodiments of the present invention with reference to the drawings. First, a structure of an electronic component mounting device 1 will be described with reference to FIGS. 1 and 2. The electronic component mounting device 1 is used in an electronic component mounting line for manufacturing a mounting board, and a plurality of the electronic component mounting devices 1 having the same structure is coupled with each other to configure the electronic component mounting line. Referring to FIG. 1, a substrate transfer mechanism 2 is arranged in the center of a base 1a in an X-direction. The substrate transfer mechanism 2 transfers a substrate 3 on which an electronic component is to be mounted in the X-direction (first direction). A substrate positioning unit that positions and holds the substrate at a mounting position is disposed in the transfer path for the substrate transfer mechanism 2, and the electronic component is mounted on the substrate 3 positioned by the substrate positioning unit.

A first component supply unit 4A and a second component supply unit 4B are arranged on both sides of the substrate transfer mechanism 2 in a Y-direction (second direction), and a plurality of tape feeders 5 is arranged in parallel on each of the first component supply unit 4A and the second component supply unit 4B. Each of the tape feeders 5 feeds a carrier tape in which the electronic component is accommodated at a pitch, and supplies the electronic component to a component mounting mechanism to be described below, that is, a component mounting mechanism including a mounting head, and a head movement mechanism that moves the mounting head.

A Y-axial movement table 8 having a Y-axial linear drive mechanism is arranged in parallel to the Y-direction, on one end of the base 1a in the X-direction. The Y-axial movement table 8 mainly includes a beam member 8a disposed in a slender configuration in a horizontal direction, and linear rails 8b are arranged on the beam member 8a in a horizontal direction. Linear blocks 9 coupled to two rectangular coupling brackets 10A and 10B, which are arranged in a vertical posture, are fitted to the linear rails 8b so as to be slidable in the Y-direction. The two coupling brackets 10A and 10B are coupled with a first X-axial movement table 11A and a second X-axial movement table 11B each having an X-axial linear drive mechanism, respectively.

Each of the first X-axial movement table 11A and the second X-axial movement table 11B mainly includes a beam member 11a disposed in a slender configuration in the X-direction, and linear rails 12 are disposed on the beam member 11a in a horizontal direction. A rectangular coupling bracket 13 arranged in a vertical posture is loaded on the linear rails 12 through a linear block (not shown) so as to be slidable in the X-direction. A first mounting head 14A and a second mounting head 14B are loaded on the respective coupling brackets 13 of the first X-axial movement table 11A and the second X-axial movement table 11B, and the first mounting head 14A and the second mounting head 14B move in the X-direction by the linear drive mechanisms coupled to the coupling brackets 13.

Each of the first mounting head 14A and the second mounting head 14B is configured by a multiple head having a plurality of unit mounting heads 15, and adsorption nozzles 15a that adsorb and hold the electronic component is loaded on a nozzle mounting unit disposed on a lower end of each unit mounting head 15. The adsorption nozzles 15a move up and down by a nozzle up/down mechanism installed in the unit mounting heads 15. The Y-axial movement table 8 and the first X-axial movement table 11A are driven to allow the first mounting head 14A to move in the X-direction and the Y-direction, as a result of which each of the unit mounting heads 15 extracts the electronic component from each of the tape feeders 5 of the first component supply unit 4A, and transfers the electronic component, and mounts the electronic component on the substrate 3 positioned by the substrate transfer mechanism 2.

Likewise, the Y-axial movement table 8 and the second X-axial movement table 11B are driven to allow the second mounting head 14B to move in the X-direction and the Y-direction, as a result of which each of the unit mounting heads 15 extracts the electronic component from each of the tape feeders 5 of the second component supply unit 4B, and transfers the electronic component, and mounts the electronic component on the substrate 3 positioned by the substrate transfer mechanism 2. In the above configuration, the Y-axial movement table 8 and the first X-axial movement table 11A configure a first head movement mechanism 7A that moves the first mounting head 14A for extracting the electronic component from the first component supply unit 4A in two directions of the X-direction (first direction) and the Y-direction (second direction). Also, the Y-axial movement table 8 and the second X-axial movement table 11B configure a second head movement mechanism 7B that moves the second mounting head 14B for extracting the electronic component from the second component supply unit 4B in two directions of the X-direction (first direction) and the Y-direction (second direction).

A first image reader 6A (first image reading unit) and a second image reader 6B (second image reading unit) are arranged between the substrate transfer mechanism 2 and the first component supply unit 4A and between the substrate transfer mechanism 2 and the second component supply unit 4B, that is, in the movement paths of the first mounting head 14A and the second mounting head 14B by the first head movement mechanism 7A and the second head movement mechanism 7B, respectively. The first image reader 6A and the second image reader 6B have the same configuration, and each have a function of reading an image of electronic components P held by the mounting head from below by allowing the first mounting head 14A and the second mounting head 14B that have extracted the electronic components P from the respective component supply units to conduct scanning operation for reading the image. The read image is subjected to recognition processing to detect a position gap of the electronic components P that is held by the mounting head.

Figure 2:
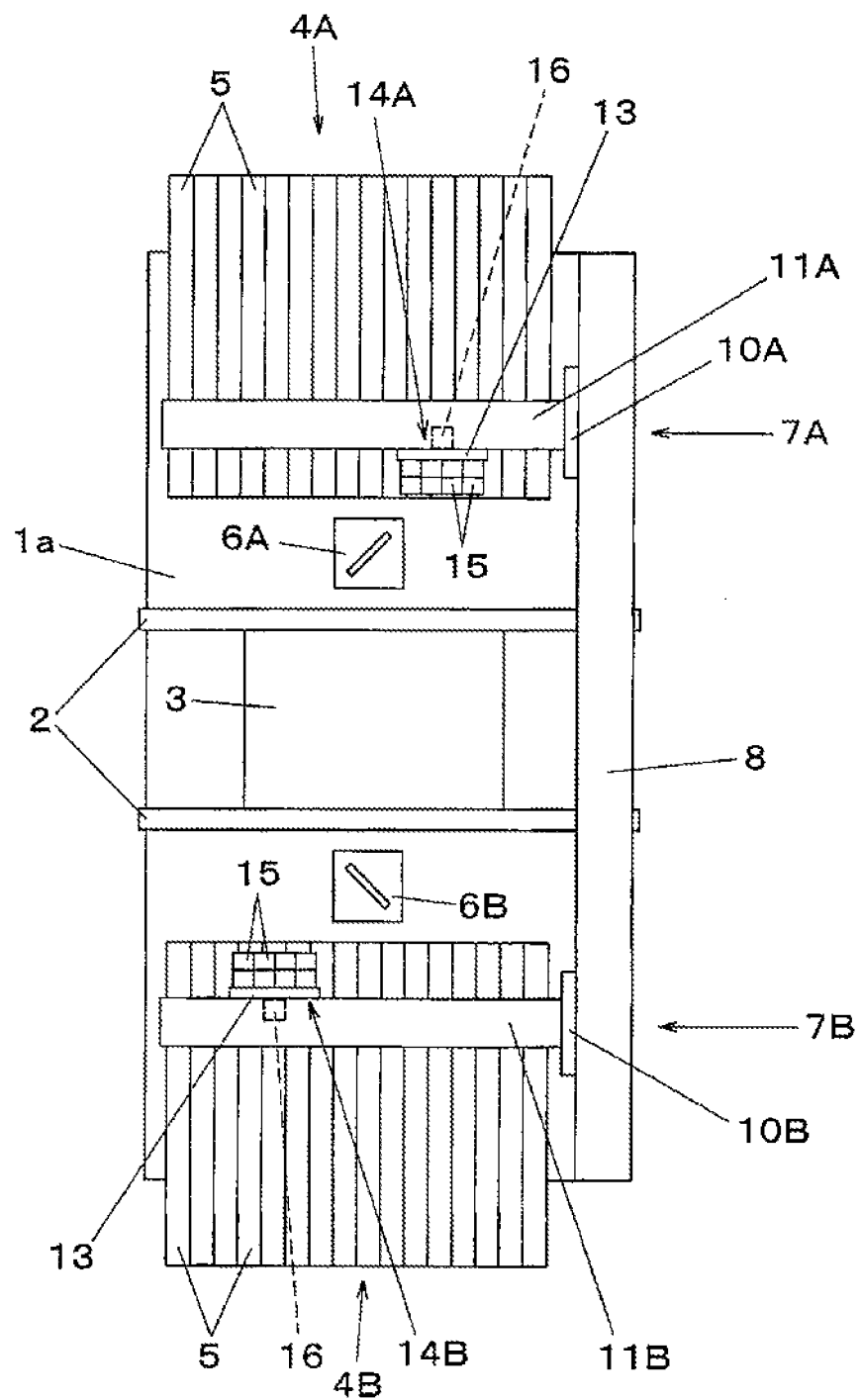
FIG. 2 is a plan view of the electronic component mounting device according to the embodiment of the present invention.

As illustrated in FIG. 2, a substrate recognition camera unit 16 that moves integrally with each of the first mounting head 14A and the second mounting head 14B is fitted to each lower portion of the first X-axial movement table 11A and the second X-axial movement table 11B. The substrate recognition camera unit 16 is fitted to the coupling bracket 13 in a posture where an imaging optical axis thereof is located downward, and moves above the substrate 3 together with each of the first mounting head 14A and the second mounting head 14B to image the substrate 3. The imaging result is subjected to the recognition processing to detect the position gap of a mounting point on the substrate 3. When the electronic component P is mounted on the substrate 3, a position correction at the time of mounting the component is conducted based on the detection result of the above-mentioned position gap of the electronic component P, and the detection result of the position gap of the mounting point.

Figure 3:
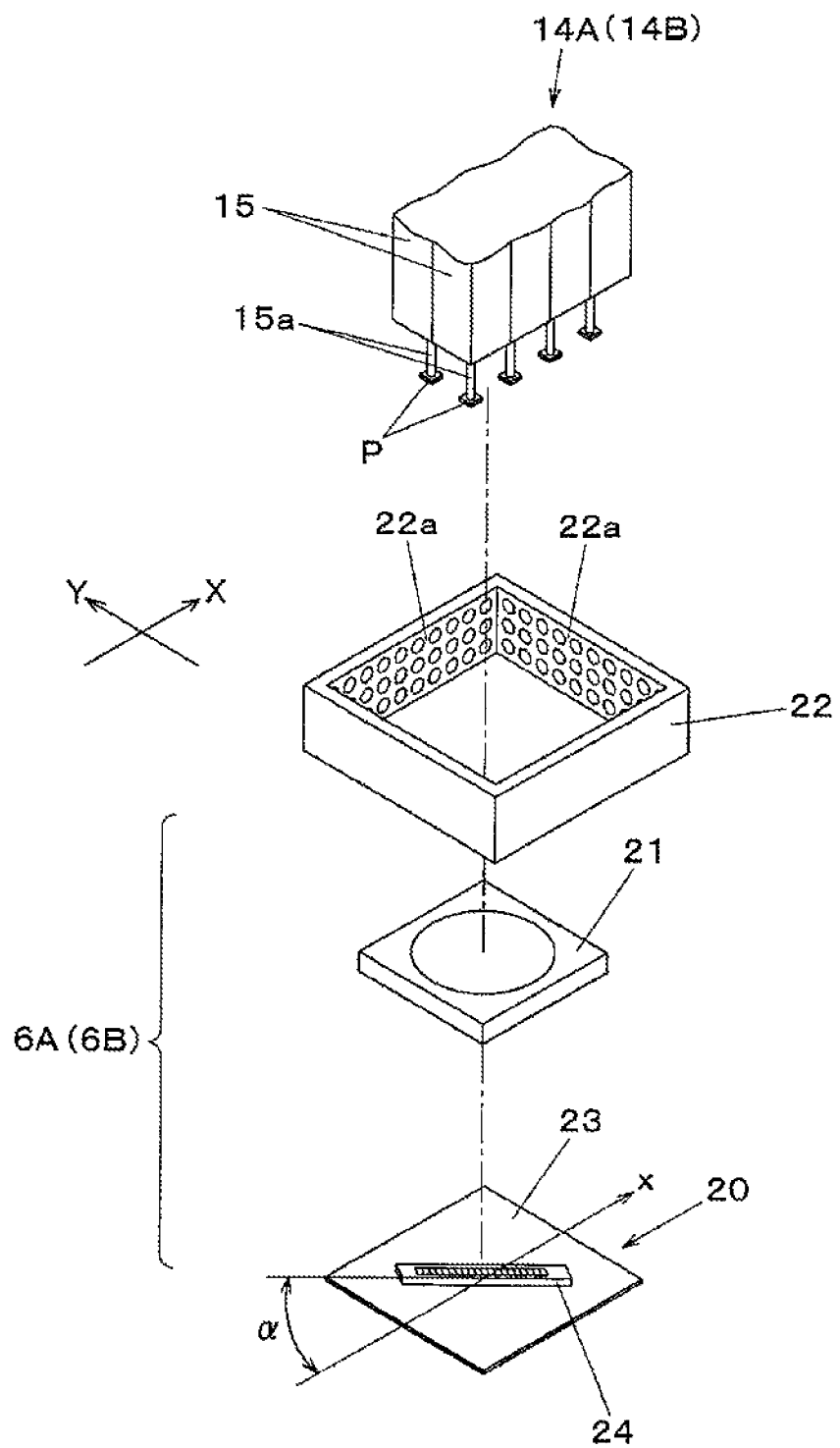
FIG. 3 is an exploded perspective view illustrating a configuration of an image reader used in the electronic component mounting device according to the embodiment of the present invention.

Subsequently, a description will be given of a configuration and a function of the first image reader 6A and the second image reader 6B with reference to FIG. 3. As illustrated in FIG. 3, each of the first image reader 6A and the second image reader 6B is configured so that a lens optical system 21 is combined above a line sensor unit 20, and an illumination unit 22 is loaded above the lens optical system 21. The line sensor unit 20 has a function of reading an imaging light reflected from an image to be read (in this example, the electronic component P held by the first mounting head 14A and the second mounting head 14B) as a one-dimensional image by a line sensor to output an image signal.

The line sensor unit 20 is configured by a sensor substrate 23 on which a line sensor 24 is mounted. The line sensor 24 is configured by linearly arraying a plurality of image pickup elements such as CCDs, and the respective image pickup elements receive the imaging light to output the image signal of the one-dimensional image. In this embodiment, the line sensor 24 is arranged obliquely with respect to the X-direction (first direction) by a given arrangement angle α (45° in this example), and a length size of the line sensor 24 is set according to an image read width required for one scanning operation. When the arrangement angle α is set to 45°, the line sensor 24 is arranged obliquely at the same angle with respect to both of the X-direction and the Y-direction, and even if the scanning operation for reading the image is set in any one of the X-direction and the Y-direction as will be described later, the one-dimensional image of the same condition can be acquired.

The lens optical system 21 has a lens for focusing the imaging light on a light receiving surface of the line sensor 24, and an imaging light input from above is refracted by the lens optical system 21 to focus an image of the imaging object on the light receiving surface of the line sensor 24. The illumination unit 22 has illumination substrates 22a on which light emitting elements such as LEDs are collected in four directions, and actuates the illumination substrates 22a to irradiate the illumination light obliquely upward. Then, in the first mounting head 14A or the second mounting head 14B, the irradiated illumination light is reflected downward by the electronic component P held by the adsorption nozzles 15a disposed in each of the unit mounting heads 15, and input to the first image reader 6A and the second image reader 6B from above.

Then, input imaging light is refracted by the lens optical system 21, and advanced downward, and focused on the image pickup elements configuring the light receiving surface of the line sensor 24. That is, the lens optical system 21 and the line sensor unit 20 function as a camera that reads the image of the electronic component P. The line sensor 24 is connected to an imaging control unit 26A (imaging control unit 26B) which is a camera controller, and an image conversion processing unit 25. The imaging control unit 26A (imaging control unit 26B) has a function of controlling imaging processing by the line sensor 24 and image conversion processing by the image conversion processing unit 25 to output the imaging result as an image signal.

Figure 5:
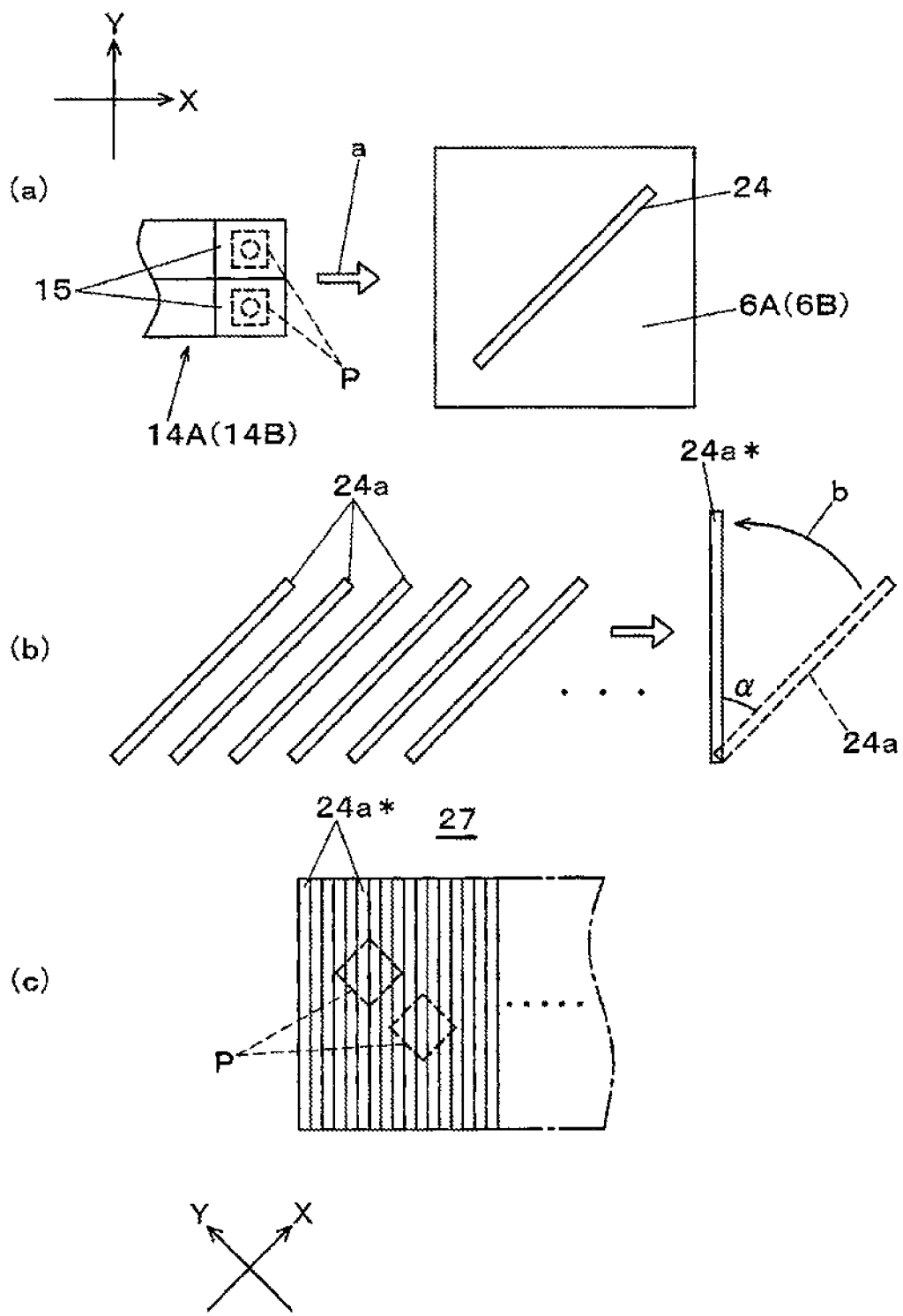
FIG. 5 is view in which (a), (b), and (c) are illustrative views of an image capture range of the image reader in the electronic component mounting device according to the embodiment of the present invention.

The image reading by the first image reader 6A and the second image reader 6B will be described with reference to (a) to (c) in FIG. 5, and (a) to (c) in FIG. 6. First, the first-directional scanning operation having the scanning direction set to the X-direction will be described with reference to (a) to (c) in FIG. 5. In this case, as illustrated in (a) in FIG. 5, the first mounting head 14A (second mounting head 14B) in which the electronic component P of the image to be read is held by the unit mounting heads 15 moves in the X-direction above the first image reader 6A and the second image reader 6B (arrow a). Through the above first-directional scanning operation, a plurality of one-dimensional images 24a corresponding to an image capture range by the line sensor 24 is sequentially output to the image conversion processing unit 25 from the line sensor 24 at given intervals, as illustrated in (b) in FIG. 5. In this example, since the line sensor 24 is arranged obliquely with respect to the X-direction by the arrangement angle α, the one-dimensional images 24a acquired by the line sensor 24 is inclined with respect to the X-direction by the arrangement angle α. In order to acquire the image whose inclination is corrected, the one-dimensional images 24a to be sequentially output are subjected to the conversion processing by the image conversion processing unit 25.

That is, the one-dimensional images 24a are rotated by a conversion angle α set based on the arrangement angle α (arrow b), to thereby acquire converted one-dimensional images 24a*. As illustrated in (e) in FIG. 5, those converted one-dimensional images 24a* are arranged in parallel to the X-direction, to thereby generate a two-dimensional image 27 of the electronic component P to be imaged. In the two-dimensional image 27 thus generated, because the image of the electronic component P is situated in a position rotated with respect to an original coordinate system by the conversion angle α, an XY coordinate system converted by the conversion angle α is used in the recognition processing based on the two-dimensional image 27.

Subsequently, second-directional scanning operation whose scanning direction is set to the Y-direction will be described with reference to (a) to (c) in FIG. 6. In this case, as illustrated in (a) in FIG. 6, the first mounting head 14A (second mounting head 14B) in which the electronic component P of the image to be read is held by the unit mounting heads 15 moves in the Y-direction above the first image reader 6A and the second image reader 6B (arrow c). Through the above second-directional scanning operation, the plurality of one-dimensional images 24a corresponding to the image capture range by the line sensor 24 is sequentially output to the image conversion processing unit 25 from the line sensor 24 at the given intervals, as illustrated in (b) in FIG. 6. In this example, since the line sensor 24 is arranged obliquely with respect to the X-direction by the arrangement angle α, the one-dimensional images 24a acquired by the line sensor 24 is inclined with respect to the X-direction by the arrangement angle α as in the example illustrated in (a) to (c) in FIG. 5. For that reason, the one-dimensional images 24a which are sequentially output are subjected to the conversion processing by the image conversion processing unit 25.

That is, the one-dimensional images 24a are rotated by the conversion angle α set based on the arrangement angle α (arrow d), to thereby acquire the converted one-dimensional images 24a*. As illustrated in (c) in FIG. 6, those converted one-dimensional images 24a* are arranged in parallel to the Y-direction, to thereby generate the two-dimensional image 27 of the electronic component P to be imaged. In the two-dimensional image 27 thus generated, as in the example illustrated in FIG. 5, because the image of the electronic component P is situated in a position rotated with respect to the original coordinate system by the conversion angle α, the XY coordinate system converted by the conversion angle α is used in the recognition processing based on the two-dimensional image 27.

That is, each of the first image reader 6A and the second image reader 6B has the line sensor 24 arranged obliquely with respect to the X-direction (first direction) by the given arrangement angle α, and has a camera that can read the image by any of the first-directional scanning operation and the second-directional scanning operation for moving the first mounting head 14A and the second mounting head 14B above the line sensor 24 in the X-direction and the Y-direction, respectively, and reading the image. Also, each of the first image reader 6A and the second image reader 6B further has an image conversion processing unit 25 that arrays the one-dimensional images 24a* obtained by converting the one-dimensional image sequentially output from the line sensor 24 based on the arrangement angle α in parallel to generate the two-dimensional image 27.

Figure 4:
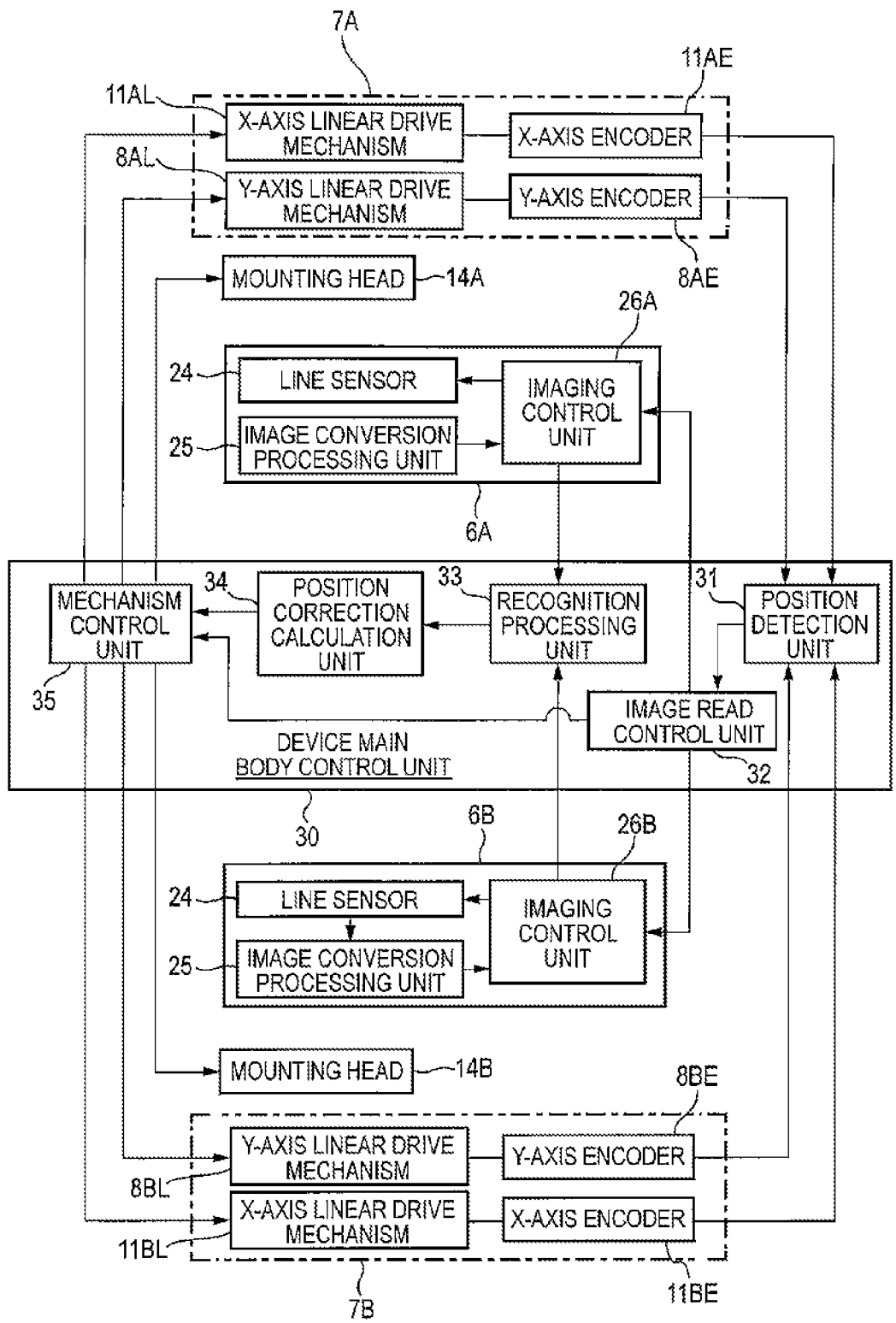
FIG. 4 is a block diagram illustrating a configuration of a control system in the electronic component mounting device according to the embodiment of the present invention.

Subsequently, a configuration of a control system of the electronic component mounting device 1 will be described with reference to FIG. 4. Referring to FIG. 4, a device main body control unit 30 includes a position detection unit 31, an image read control unit 32, a recognition processing unit 33, a position correction calculation unit 34, and a mechanism control unit 35. The position detection unit 31 receives signals from an X-axis encoder 11AE and a Y-axis encoder 8AE disposed in an X-axis linear drive mechanism 11AL and a Y-axis linear drive mechanism 8AL configuring the first head movement mechanism 7A to detect a position of the first mounting head 14A. Also, the position detection unit 31 receives signals from an X-axis encoder 11BE and a Y-axis encoder 8BE disposed in an X-axis linear drive mechanism 11BL and a Y-axis linear drive mechanism 8BL configuring the second head movement mechanism 7B to detect a position of the second mounting head 14B.

The image read control unit 32 controls the imaging control unit 26A and the imaging control unit 26B of the first image reader 6A and the second image reader 6B based on a position detection result of the position detection unit 31. That is, the first image reader 6A and the second image reader 6B move the first mounting head 14A and the second mounting head 14B in the scanning direction, and conduct the scanning operation of reading the image of the electronic component held by the first mounting head 14A and the second mounting head 14B. The image read control unit 32 instructs the imaging control unit 26A and the imaging control unit 26B about a timing at which an X-column line sensor 24X or a Y-column line sensor 24Y starts to output the image signal in the scanning operation, based on the position detection result of the first mounting head 14A and the second mounting head 14B by the position detection unit 31.

Further, as will be described later, the image read control unit 32 selects in which direction the electronic component moves with respect to the line sensor 24 to conduct the scanning operation for reading the image of the electronic component P. That is, the image read control unit 32 has a function of selecting any one of the first-directional scanning operation and the second-directional scanning operation according to the operation state of the first mounting head 14A and the second mounting head 14B to instruct the imaging control unit 26A and the imaging control unit 26B about the selected scanning operation. This operation state is determined based on the positions of the first mounting head 14A and the second mounting head 14B, which are detected by the position detection unit 31. The selection is conducted based on the scanning operation selection conditions which are set in advance and stored in a storage device of the device main body control unit 30.

In this situation, the first mounting head 14A and the second mounting head 14B conduct the component mounting operation of transferring and mounting the electronic components P extracted from the respective component supply units (the first component supply unit 4A, the second component supply unit 4B) onto the substrate 3 positioned by the substrate positioning unit of the substrate transfer mechanism 2. That is, the image read control unit 32 selects any one of the first-directional scanning operation and the second-directional scanning operation is to be conducted by the first mounting head 14A and the second mounting head 14B based on the predetermined scanning operation selection conditions in order to read the image of the electronic component in the component mounting operation.

The recognition processing unit 33 receives the image signals output from the imaging control unit 26A and the imaging control unit 26B of the first image reader 6A and the second image reader 6B, and conducts the recognition processing, to thereby discriminate the electronic component which is held by the mounting head, and detect the position gap of the electronic component. The position correction calculation unit 34 conducts calculation necessary for the position correction when the electronic component is mounted on the substrate by the mounting head, based on the position gap information of the electronic component, which is obtained by the recognition processing unit 33. In the example illustrated in FIG. 4, the image read control unit 32 and the recognition processing unit 33 are included in the device main body control unit 30. Alternatively, the image read control unit 32 and the recognition processing unit 33 may be provided as separate image recognition processing units independent from the device main body control unit 30.

The mechanism control unit 35 controls the first head movement mechanism 7A, the first mounting head 14A, the second head movement mechanism 7B, and the second mounting head 14B to execute the component mounting operation for transferring and mounting the electronic component P extracted from the respective component supply units onto the substrate 3. In this situation, the respective mounting heads are allowed to conduct any one of the first-directional scanning operation and the second-directional scanning operation selected by the image read control unit 32. When the held electronic component P is mounted on the substrate 3, the first mounting head 14A and the second mounting head 14B are positioned based on the position gap correction calculation result obtained by the position correction calculation unit 34.

Figure 7:
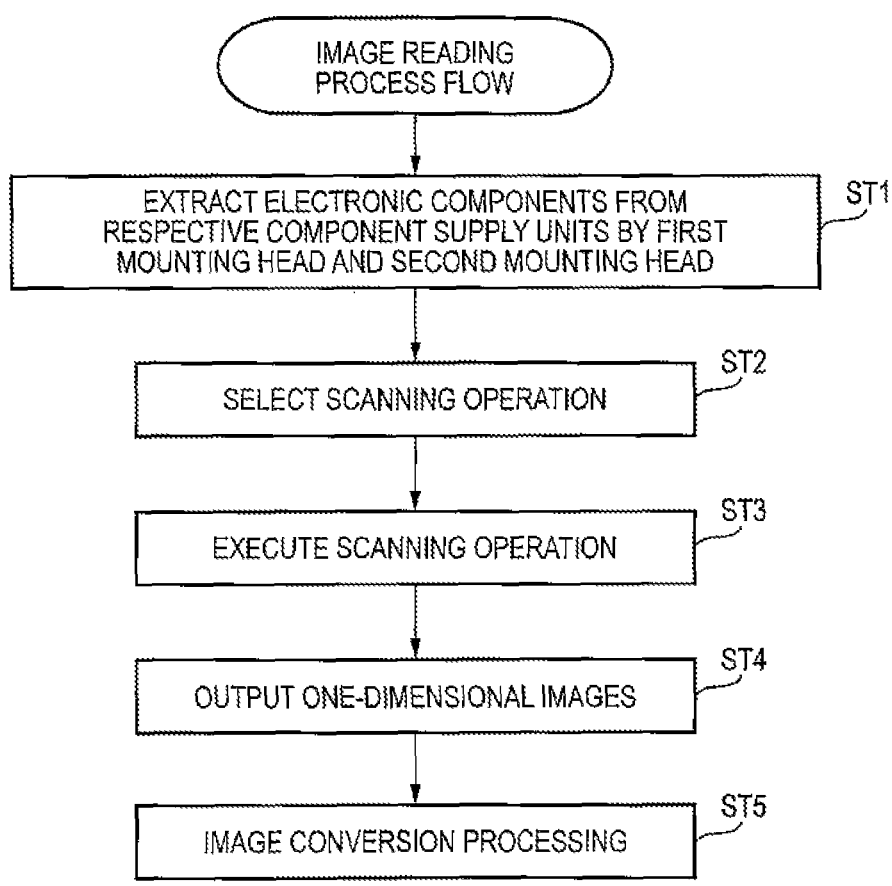
FIG. 7 is a flowchart illustrating an image reading method in the electronic component mounting device according to the embodiment of the present invention.

The electronic component mounting device 1 according to this embodiment is configured as described above, and an image reading method in the electronic component mounting device that reads the image of the electronic components P held by the first mounting head 14A and the second mounting head 14B in the electronic component mounting device 1 will be described below with reference to the respective drawings along a flow of FIG. 7.

First, in starting the component mounting operation, the first mounting head 14A and the second mounting head 14B extract the electronic components P from the respective component supply units (ST1) (component extracting step). (a) in FIG. 8 illustrates a state in which, in the first component supply unit 4A, the first mounting head 14A moves in order to extract the electronic components P by the plurality of unit mounting heads 15 (arrow e), and in the second component supply unit 4B, the second mounting head 14B holds the electronic components P by all of the plurality of unit mounting heads 15, and completes the component extracting step.

Then, the scanning operation is selected (ST2). That is, any one of the first-directional scanning operation and the second-directional scanning operation is to be conducted by the second mounting head 14B that has completed the component extracting step in advance is selected based on the predetermined scanning operation selection conditions (scanning operation selecting step). In this example, the scanning operation selection condition is set in advance so that the second-directional scanning operation is selected if the component mounting operation is not conducted by the facing mounting heads in the substrate 3 positioned to the substrate transfer mechanism 2 at the time of completing the component extracting step, and the first-directional scanning operation is selected if the component mounting operation is conducted in the substrate 3 at the time of completing the component extracting step.

Figure 8:
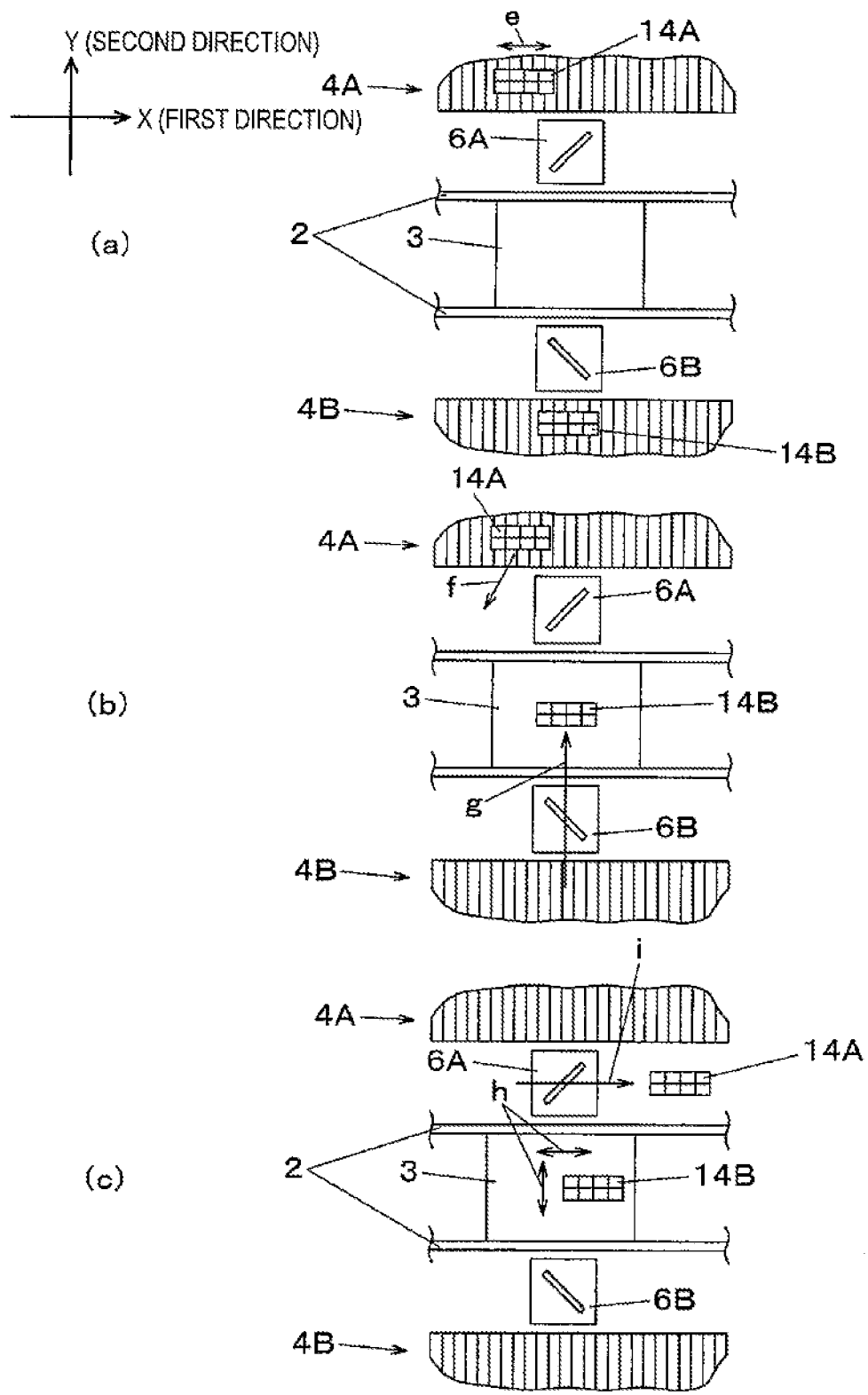
FIG. 8 is view in which (a), (b), and (c) are illustrative views illustrating the operation of the image reading method in the electronic component mounting device according to the embodiment of the present invention.

That is, in the state illustrated in (a) in FIG. 8, at the time of completing the component extracting step by the second mounting head 14B in the second component supply unit 4B, the component extracting step has not yet been completed in the first component supply unit 4A, and the facing first mounting heads 14A are not present on the substrate 3. Therefore, in this case, as the scanning operation to be conducted by the second mounting head 14B that has completed the component extracting step, the second-directional scanning operation is selected. As a result, the second mounting head 14B can move in the shortest path from the second component supply unit 4B toward the substrate 3, and a movement distance in the component mounting operation can be most shortened to reduce an operation tact time.

Then, the scanning operation is executed (ST3). In this situation, the selected second-directional scanning operation is conducted by the second mounting head 14B to acquire the image signal from the second image reader 6B (image acquiring step). That is, in the image acquiring step, as illustrated in (b) in FIG. 8, the second mounting head 14B that holds the electronic components P to be scanned moves in the Y-direction, and arrives at the substrate 3 (arrow g). In movement in the Y-direction, the second mounting head 14B moves at a specified scanning speed above the second image reader 6B, and in this situation, as illustrated in (a) in FIG. 6, the plurality of one-dimensional images 24a of the electronic components P to be imaged is sequentially read at given intervals by the line sensor 24, and output to the image conversion processing unit 25 (ST4).

Figure 6:
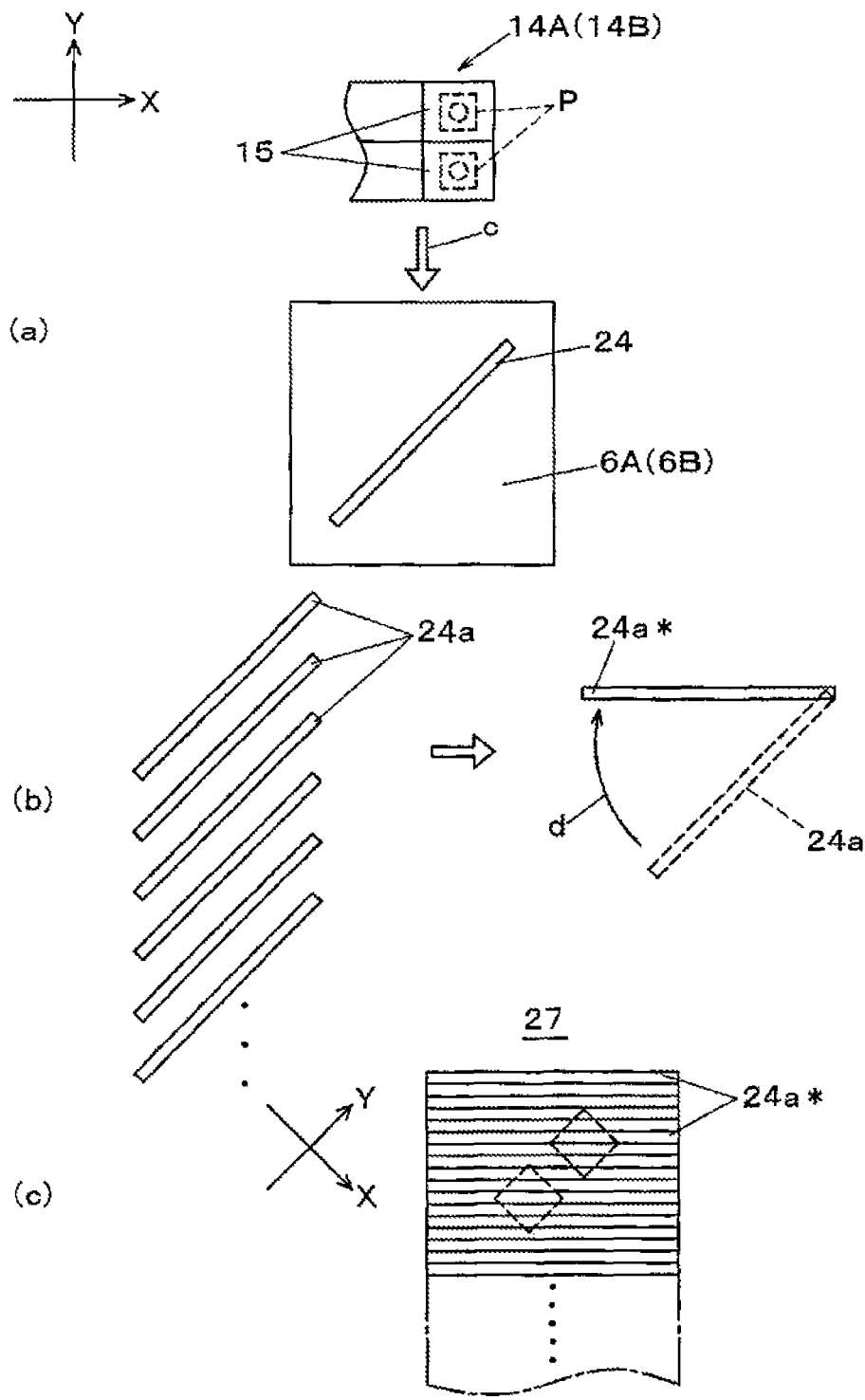
FIG. 6 is view in which (a), (b), and (c) are plan views of the image capture range of the image reader in the electronic component mounting device according to the embodiment of the present invention.

The image conversion processing unit 25 that has received the one-dimensional images 24a executes the image conversion processing on the one-dimensional images 24a sequentially output from the line sensor 24 as illustrated in (b) and (c) in FIG. 6 (ST5). In this image conversion processing, the processing for arranging the converted one-dimensional images 24a\* obtained by converting the one-dimensional images 24a based on the arrangement angle α of the line sensor 24 in parallel to generate the two-dimensional image 27 is conducted. The two-dimensional image 27 thus generated is output to the recognition processing unit 33 as the image signal of the electronic components P to be imaged.

Thereafter, the scanning operation intended for the first mounting head 14A is executed. In this case, because the facing second mounting heads 14B have already been present on the substrate 3 at the time of completing the component extracting step by the first mounting head 14A, the first-directional scanning operation is selected. In parallel to the second-directional scanning operation intended for the second mounting head 14B, the first mounting head 14A that has completed the component extracting step in the first component supply unit 4A moves toward a side of the first image reader 6A in order to execute the selected first-directional scanning operation as illustrated in (b) in FIG. 8 (arrow As illustrated in (c) in FIG. 8, in parallel to the component mounting operation (arrow h) on the substrate 3 by the second mounting head 14B, the first-directional scanning operation (arrow i) for moving the first mounting head 14A above the first image reader 6A at a specified scanning speed in the X-direction is executed in the same manner as that of the example illustrated in (a) to (c) in FIG. 5. That is, the image conversion processing for converting the one-dimensional images 24a sequentially output from the line sensor 24 based on the arrangement angle α of the line sensor 24 is executed, and the processing of arranging the converted one-dimensional images 24a\* in which the image has been converted in parallel to generate the two-dimensional image 27 is executed. The two-dimensional image 27 thus generated is output to the recognition processing unit 33 as the image signal of the electronic components P to be imaged.

After the first-directional scanning operation has been completed, the first mounting head 14A waits at a side of the first image reader 6A. Since this first-directional scanning operation can be executed without interfering with the component mounting operation of the facing second mounting heads 14B, a loss time during which the first mounting head 14A waits at the first component supply unit 4A without movement can be prevented from occurring.

Figure 9:
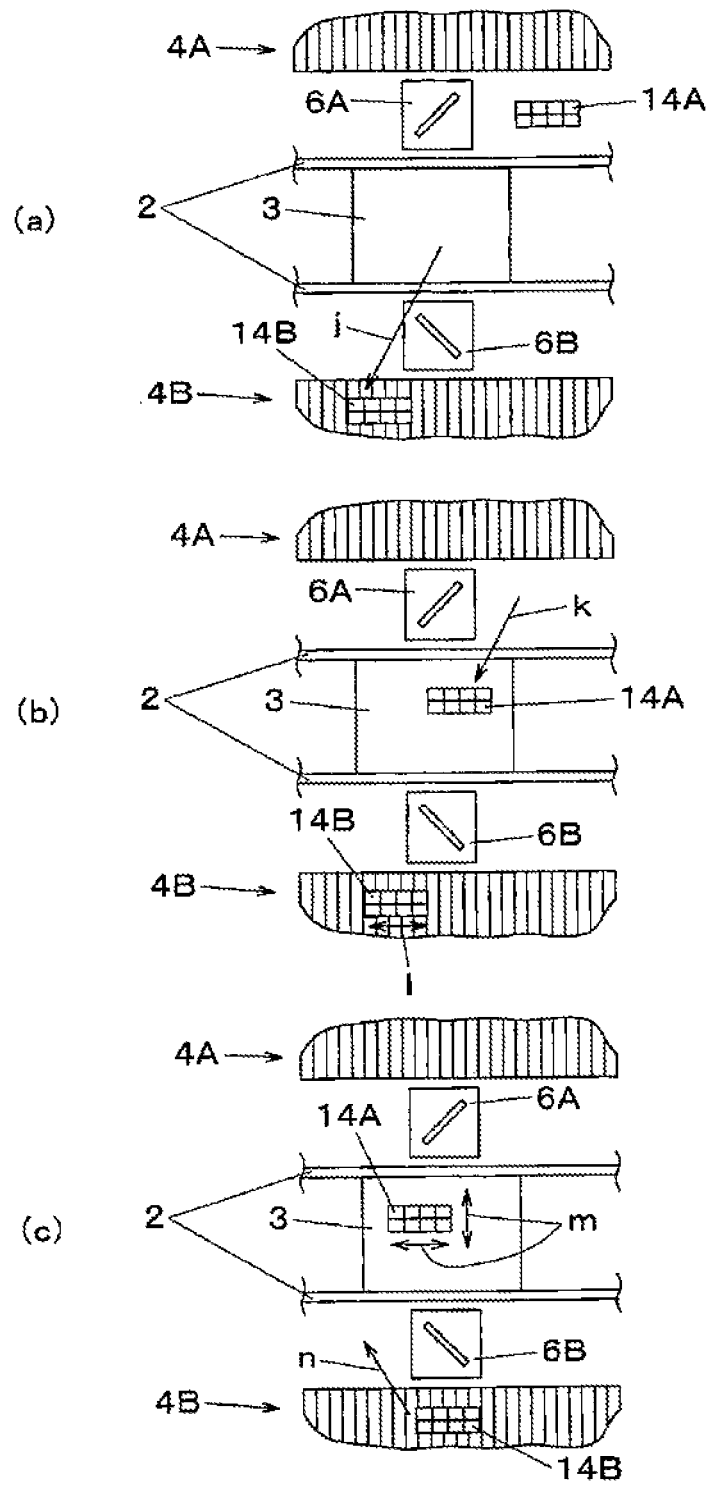
FIG. 9 is view in which (a), (b), and (c) are illustrative views illustrating the operation of the image reading method in the electronic component mounting device according to the embodiment of the present invention.

Thereafter, as illustrated in (a) in FIG. 9, the second mounting head 14B that has finished the component mounting operation on the substrate 3 moves to the second component supply unit 4B in order to execute a subsequent component extracting step (arrow j). Thereafter, as illustrated in (b) in FIG. 9, the first mounting head 14A that has been in the standby state moves above the substrate 3 immediately (arrow k), and in the second component supply unit 4B, the second mounting head 14B moves in order to extract the component (arrow l). Thereafter, the second mounting head 14B completes the component extracting step, and at this time, as illustrated in (c) in FIG. 9, if the first mounting head 14A is located on the substrate 3, and the component mounting operation (arrow m) is executed, the first-directional scanning operation is selected as the scanning operation to be conducted by the second mounting head 14B. Then, the second mounting head 14B moves toward a side of the second image reader 6B in order to execute the first-directional scanning operation for moving above the second image reader 6B in the X-direction (arrow n).

Thereafter, the component mounting operation is repetitively executed by the first mounting head 14A and the second mounting head 14B. In the component mounting operation, the scanning operation of extracting the electronic components P from the first component supply unit 4A and the second component supply unit 4B, moving the electronic components P above the first image reader 6A and the second image reader 6B, and reading the image of the electronic components P is executed. In the scanning operation, any one of the first-directional scanning operation and the second-directional scanning operation is selected according to the operating state of the component mounting mechanisms that face each other through the substrate transfer mechanism 2 for each scanning operation.

That is, the above-mentioned image reading method includes the component extracting step of extracting the electronic components P from the respective component supply units by the first mounting head 14A and the second mounting head 14B, the scanning operation selecting step of selecting any one of the first-directional scanning operation and the second-directional scanning operation is to be conducted by the first mounting head 14A and the second mounting head 14B in order to read the image of the electronic components, based on the predetermined scanning operation selecting conditions, and the image acquiring step of acquiring the image signals from the first image reader 6A and the second image reader 6B by conducting the selected scanning operation by the first mounting head 14A and the second mounting head 14B.

In the scanning operation selecting step, when the component mounting operation using the facing mounting heads on the substrate 3 positioned to the substrate transfer mechanism 2 is not conducted at the time of completing the component extracting step, the second-directional scanning operation is selected, and when the component mounting operation is conducted at the time of completing the component extracting step, the first-directional scanning operation is selected. Then, in the image acquiring step, the image conversion processing of arraying the converted one-dimensional images 24a* obtained by converting the one-dimensional images 24a sequentially output from the line sensor 24 based on the arrangement angle α of the line sensor in parallel, to generate the two-dimensional image 27 is executed.

As described above, according to this embodiment, in the electronic component mounting device 1 configured so that the component mounting mechanisms that mount the electronic components by the first component supply unit 4A, the second component supply unit 4B, the first mounting head 14A, and the second mounting head 14B are arranged on both sides of the substrate transfer mechanism 2, there are provided the first image reader 6A and the second image reader 6B that read the images of the electronic components held by the first mounting head 14A and the second mounting head 14B from below. In this configuration, each of the first image reader 6A and the second image reader 6B includes the camera that can read the image by any of the first-directional scanning operation and the second-directional scanning operation of moving the first mounting head 14A and the second mounting head 14B in the first direction and the second direction above the line sensor 24 arranged obliquely with respect to the first direction by a given arrangement angle, respectively, to read the images. Also, each of the first image reader 6A and the second image reader 6B includes the image conversion processing unit 25 that arrays the converted one-dimensional images 24a obtained by converting the one-dimensional images 24a sequentially output from the line sensor 24 based on the arrangement angle α in parallel, to generate the two-dimensional image 27. With the above configuration, it is possible to reduce the required time for reading the image with the exclusion of the restriction of the operation of the first mounting head 14A and the second mounting head 14B caused in the array direction of the line sensor 24 by an image reading unit having the simple configuration.

That is, in the component mounting operation of transferring and mounting the electronic components extracted from the first component supply unit 4A and the second component supply unit 4B by the first mounting head 14A and the second mounting head 14B, respectively, any one of the first-directional scanning operation and the second-directional scanning operation, which is smaller in a tact time loss, can be selected according to the operation state of the facing component mounting mechanisms in order to read the images of the electronic components. As a result, the required time for reading the image can be reduced while eliminating the tact time loss as much as possible, and the tact time of the component mounting operation can be improved.

The above embodiment shows an example where, in the electronic component mounting device having the component mounting mechanisms disposed on both sides of the substrate transfer mechanism, the first image reader 6A (second image reader 6B) is used. The advantages obtained by using the configuration using the camera that can read the images by any of the first-directional scanning operation and the second-directional scanning operation as the image reading unit are not limited to the electronic component mounting device configured so that the component mounting mechanisms are disposed on both sides of the substrate transfer mechanism.

That is, even in the electronic component mounting device configured so that the component mounting mechanism is arranged on only one side of the substrate transfer mechanism, the first-directional scanning operation or the second-directional scanning operation can be selected in the image reading operation after extracting the component. As a result, a shorter one the movement paths of the mounting head extending from the component supply unit to the mounting point of the substrate can be selected, and likewise the tact time of the component mounting operation can be improved. In this case, the scanning operation selecting conditions are so set as to select the scanning operation in the shorter movement path extending from the position of the mounting head at the time of completing the component extracting step to the mounting point of the substrate in the component mounting operation in the component supply unit. The improvement effects of the tact time becomes more remarkable in the electronic component mounting device configured so that the component mounting mechanisms are arranged on both sides of the substrate transfer mechanism, as shown in this embodiment.

According to the present invention, modifications and applications by an ordinary skilled person based on the disclosure of the present specification and known techniques without departing from the subject matter and scope of the present invention are also intended by the present invention, and included in a scope to be protected. Also, the respective components in the above embodiments may be arbitrarily combined together without departing from the subject matter of the present invention.

The present invention is based on Japanese Patent Application No. 2011-034090 filed on Feb. 21, 2011, and content thereof is incorporated herein by reference.

INDUSTRIAL APPLICABILITY

The electronic component mounting device, and the image reading method in the electronic component mounting device according to the present invention have such an advantage that a required time for reading the image can be reduced with the exclusion of the restriction of the operation of the mounting head caused in the array direction of the line sensor by an image reading unit having the simple configuration, and is useful in the component mounting field in which a work for mounting the electronic component on the substrate is conducted after the image of the electronic component extracted from the component supply unit is read, and the position is recognized.

LIST OF REFERENCE SIGNS 1 electronic component mounting device
2 substrate transfer mechanism
3 substrate
4A first component supply unit
4B second component supply unit
6A first image reader
6B second image reader
7A first head movement mechanism
7B second head movement mechanism
14A first mounting head
14B second mounting head
20 line sensor unit
24 line sensor
24$a$ one-dimensional image
24$a$* converted one-dimensional image
27 two-dimensional image

The invention claimed is:

1. An electronic component mounting device, comprising:
a substrate transfer mechanism that transfers a substrate on which an electronic component is to be mounted in a first direction;
a substrate positioning unit that is disposed in a transfer path by the substrate transfer mechanism, and positions the substrate;
a component supply unit that is arranged on a side of the substrate transfer mechanism in a second direction orthogonal to the first direction;
a head movement mechanism that moves a mounting head for extracting the electronic component from the component supply unit in two directions of the first direction and the second direction;
an image reading unit that is disposed in a movement path of the mounting head by the head movement mechanism, and reads an image of the electronic component held by the mounting head from below by conducting a scanning operation for reading the image by the mounting head; and
an image reading control unit that controls the image reading unit,
wherein the image reading unit has a line sensor arranged obliquely with respect to the first direction by a given arrangement angle on a plane including the first direction and the second direction, and has a camera that can read the image by any of first-directional scanning operation and second-directional scanning operation for moving the mounting head in the first direction and the second direction above the line sensor, respectively, to read the image,
wherein the image reading unit has an image conversion processing unit that generates a two-dimensional image based on the arrangement angle and one-dimensional images sequentially output from the line sensor,
wherein the image reading control unit selects any one of the first-directional scanning operation and the second-directional scanning operation is to be conducted by the mounting head in order to read the image of the electronic component based on a predetermined scanning operation selecting condition, in the component mounting operation for transferring and mounting the electronic component extracted from the component supply unit onto the substrate positioned by the substrate positioning unit by the mounting head, and controls the image reading unit based on a selection result thereof, and
wherein the scanning operation selecting condition is set so that the second-directional scanning operation is selected if the component mounting operation is not conducted by another mounting head that facing the mounting head in the substrate positioned to the substrate transfer mechanism at a time of completing the extracting of the electronic component from the component supply unit by the mounting head, and the first-directional scanning operation is selected if the component mounting operation is conducted in the substrate positioned to the substrate transfer mechanism at the time of completing the extracting of the electronic component.

2. An image reading method in an electronic component mounting device that reads an image of an electronic component held by a mounting head, the electronic component mounting device including: a substrate transfer mechanism that transfers a substrate on which the electronic component is to be mounted in a first direction; a substrate positioning unit that is disposed in a transfer path by the substrate transfer mechanism, and positions the substrate; a component supply unit that is arranged on a side of the substrate transfer mechanism in a second direction orthogonal to the first direction; a head movement mechanism that moves the mounting head for extracting the electronic component from the component supply unit in two directions of the first direction and the second direction; an image reading unit that has a line sensor disposed in a movement path of the mounting head by the head movement mechanism, and arranged obliquely with respect to the first direction by a given arrangement angle on a plane including the first direction and the second direction, and reads the image of the electronic component held by the mounting head from below by conducting a scanning operation for reading the image by the mounting head, and the image reading unit has an image conversion processing unit that generates a two-dimensional image based on the arrangement angle and one-dimensional images sequentially output from the line sensor; and an image reading control unit that controls the image reading unit, and the image reading control unit selects any one of the first-directional scanning operation and the second-directional scanning operation is to be conducted by the mounting head in order to read the image of the electronic component based on a predetermined scanning operation selecting condition, in the component mounting operation for transferring and mounting the electronic component extracted from the component supply unit onto the substrate positioned by the substrate positioning unit by the mounting head, and controls the image reading unit based on a selection result thereof, the image reading method comprising:
- a component extracting step of extracting the electronic component from the respective component supply units by the mounting heads;
- a scanning operation selecting step of selecting any one of first-directional scanning operation and second-directional scanning operation is to be conducted by the mounting head based on a predetermined scanning operation selecting condition in order to read the image of the electronic component; and
- an image acquiring step of conducting the selected scanning operation by the mounting head to acquire an image signal from the image reading unit,
- wherein the scanning operation selecting condition is set so that the second-directional scanning operation is selected if the component mounting operation is not conducted by another mounting head that facing the mounting head in the substrate positioned to the substrate transfer mechanism at a time of completing the extracting of the electronic component from the component supply unit by the mounting head, and the first-directional scanning operation is selected if the component mounting operation is conducted in the substrate positioned to the substrate transfer mechanism at the time of completing the extracting of the electronic component.

* * * * *